US009192059B2

(12) United States Patent
Blaha et al.

(10) Patent No.: US 9,192,059 B2
(45) Date of Patent: Nov. 17, 2015

(54) BATTERY HOLDER FOR PRINTED CIRCUIT BOARD

(75) Inventors: Thomas Blaha, Garden City, NY (US); Charles Engelstein, New York, NY (US)

(73) Assignee: MEMORY PROTECTION DEVICES, INC., Farmingdale, NY (US)

( * ) Notice: Subject to any disclaimer, the term of this patent is extended or adjusted under 35 U.S.C. 154(b) by 846 days.

(21) Appl. No.: 13/078,564

(22) Filed: Apr. 1, 2011

(65) Prior Publication Data

US 2012/0251864 A1 Oct. 4, 2012

(51) Int. Cl.
*H01M 2/02* (2006.01)
*H05K 3/30* (2006.01)
*H05K 3/34* (2006.01)

(52) U.S. Cl.
CPC .............. *H05K 3/301* (2013.01); *H05K 3/3447* (2013.01); *H05K 2201/10037* (2013.01); *H05K 2201/10606* (2013.01)

(58) Field of Classification Search
CPC ....................................................... H01M 2/02
USPC ........................................................ 429/100
See application file for complete search history.

(56) References Cited

U.S. PATENT DOCUMENTS

| 5,528,460 | A | 6/1996 | Byrd |
| 6,062,901 | A | 5/2000 | Liu |
| 6,600,525 | B1 | 7/2003 | Sawai et al. |
| 7,118,817 | B2 | 10/2006 | Bartholf et al. |
| 7,217,153 | B2 | 5/2007 | Sugimoto et al. |
| 7,591,672 | B2 | 9/2009 | Wu |
| 7,641,509 | B2 | 1/2010 | Chen et al. |
| 2004/0241542 | A1* | 12/2004 | Nakamura et al. ............ 429/181 |
| 2010/0059644 | A1* | 3/2010 | Sun ............................ 248/309.1 |

* cited by examiner

*Primary Examiner* — Ula C Ruddock
*Assistant Examiner* — Jacob Marks
(74) *Attorney, Agent, or Firm* — Gottlieb, Rackman & Reisman, PC

(57) ABSTRACT

A battery holder for attachment to a printed circuit board includes a base, a positive conductor, a negative conductor and a top. The base is to be fixed to the printed circuit board and the two conductors are fixed to the base. The top includes a window for viewing the polarity of the battery and is selectively attached to the base by a series of latches.

23 Claims, 6 Drawing Sheets

BATTERY HOLDER FOR PRINTED CIRCUIT BOARD

FIELD OF THE INVENTION

This invention relates to a battery holder positioned on a printed circuit board having a height nominally greater than the height of an enclosed battery. The battery holder includes a base, a top, a positive conductor and a negative conductor.

BACKGROUND

All devices that use batteries require at least one battery holder. The battery holder is the structure or system that holds the battery in a fixed position and provides an electrical connection between the battery and the device.

Existing battery holders are not necessarily concerned with saving space and may be large and bulky. In the context of a printed circuit board, space is very limited and minimizing both area and height are very important.

Additionally, existing battery holders completely enclose the battery. Thus, in order to ascertain the polarity of the battery, one must either open the battery holder or remove the battery from the battery holder. This is problematic when working with printed circuit boards that require different polarities for different applications.

U.S. Pat. No. 6,062,901 issued to Jia-Hung Liu et al. on May 16, 2000 discloses a button battery holder for application to a printed circuit board. The holder comprises a closed bottom, side walls and positive and negative terminals. At least one of the side walls includes an access opening. The two terminals are secured to the holder and extend through corresponding slits in the bottom of the holder. The holder of Liu et al does not provide a minimal height and does not provide visual access to the polarity of the battery.

SUMMARY OF THE INVENTION

To solve the limitations existing in the field of battery holders, the present invention is provided. The battery holder includes a base, a positive conductor, a negative conductor and a top. The base of the battery holder is fixed to a printed circuit board. The top includes a window for viewing the polarity of the battery and the top selectively attaches to the base by a plurality of latches. The space between the base and top forms a battery compartment that is sized and shaped for holding a battery.

Connected to the base and extending into the battery compartment are a positive conductor and a negative conductor. Each conductor includes a battery contact, a mounting surface or pin and a connector for connecting to the base. The battery contact extends into the battery compartment and makes an electrical connection with the battery. The mounting surface or pin extends away from the battery compartment and is electrically connected to the printed circuit board.

The structure and elements described herein minimize the profile of the battery holder while providing optimal functionality. The latches allow for easy access to the battery compartment, while the window allows the polarity of the battery to be viewed during installation of the printed circuit board.

DETAILED DESCRIPTION OF THE INVENTION

Figure 1:
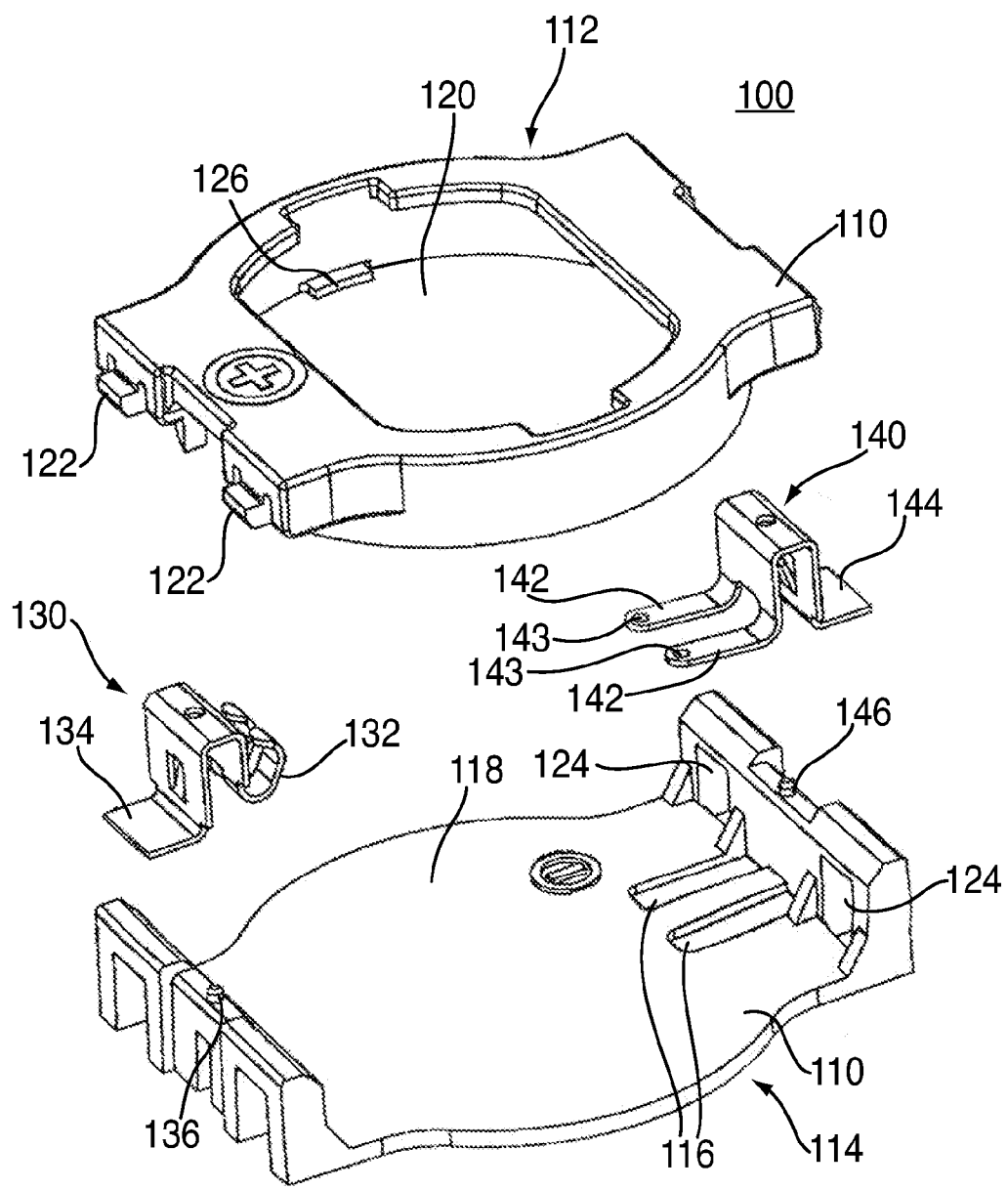
FIG. 1 is an exploded perspective view of a first embodiment of the battery holder of the present invention.
Figures 2, 3:
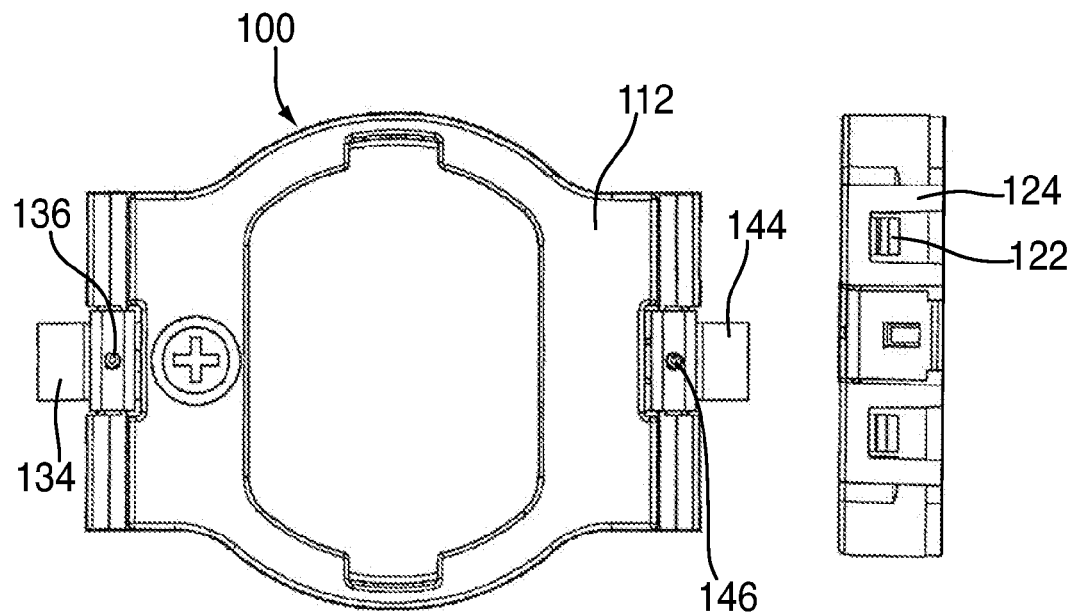
FIG. 2 is a top view of the first embodiment of the battery holder of the present invention.
FIG. 3 is a front view thereof.

FIGS. 1-6 illustrate the first embodiment of the present invention. Battery holder 100 includes a carrier 110 for affixing a battery B to a printed circuit board (not shown). Carrier 110 includes a top 112 and a base 114. Battery holder 100 further includes a positive conductor 130 and a negative conductor 140. Positive conductor 130 and negative conductor 140 are each fixed to the base 114 by a first connector 136 and a second connector 146, respectively. Connectors 136, 146 are shown as snap-fit connectors but may comprise fasteners, glue, etc. Base 114 preferably includes negative contact depression 116.

Top 112 and base 114 are designed and adapted for battery holder 100 to have a height nominally greater than that of the battery B being enclosed. It is preferable for the base 114 and the top 112 to each have a height of 0.030 inches. In one embodiment, using a dish-shaped battery, the overall height of battery holder 100 is 0.19 inches.

Positive connector 130 includes a positive battery contact 132 and a positive mounting surface 134. Positive battery contact 132 has a preferably curved shape extending outward into a battery compartment 118. Positive mounting surface 134 is preferably flat, substantially parallel to the bottom of the battery holder 100 and extends outward from battery compartment 118.

Negative connector 140 includes a negative battery contact 142 and a negative mounting surface 144. Negative battery contact 142 preferably comprises two flat projections that extend outward into battery compartment 124, each flat projection having a contact bump 143. Contact bumps 143 extend into battery compartment 118.

Negative battery contact 142 is adapted to fit into negative contact depression 116. Negative contact depression 116 is designed to allow negative battery contact 142 to rest below a battery located in the battery compartment 118, while allowing the battery B to substantially rest on the floor of the battery compartment 118. Accordingly, the bottom of the battery is in contact with contact bumps 143.

Figure 4:
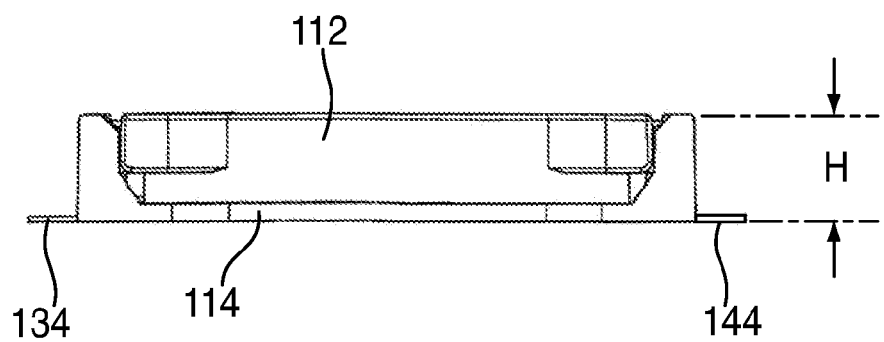
FIG. 4 is a side view thereof.

Negative connector 140 also includes a negative mounting surface 144. Negative mounting surface 144 is preferably flat and extends outward from the battery compartment 118. As shown in FIG. 4, when conductors 130, 140 are fixed to base 114, negative mounting surface 144 and positive mounting surface 134 are parallel to the bottom of base 114.

Top 112 is adapted to selectively connect with base 114. Top 112 includes a window 120 and a plurality of latch-tops 122. Latch-tops 122 selectively engage with latch-bottoms 124, which are integrated elements of base 114. Window 120 is sized and shaped to enclose the battery B while providing visual access to the polarity of the battery B during installation of the printed circuit board.

Top 112 is sized and shaped to enclose base 114, positive conductor 130 and negative conductor 140. Top 112 is preferably constructed of plastic and insulates positive conductor 130 and negative conductor 140 from unintended contact with other electrical elements on the printed circuit board.

Top 112 further includes battery lock 126. Battery lock 126 extends inward from the side of top 112 at the side's lowermost level. Battery lock 126 extends a minimal distance such that the flexibility of the material of top 112 allows a battery to be inserted into top 112 and locked in place by battery lock 126. The battery can then be removed by flexing the sides of top 112 away from each other and applying force to the battery through window 120. Accordingly, top 112 can independently hold a battery and the combination of top 112 and a battery are latched to base 114 as described herein.

As illustrated by FIG. 4, one benefit of battery holder 100 is the decreased overall height H it provides. Battery holder 100 has an overall height H that is nominally larger than the overall height of the battery B it holds. In a preferred embodiment, battery holder 100 contains a dish-shaped battery and the overall height H of battery holder 100 is 0.19 inches.

Figure 6:
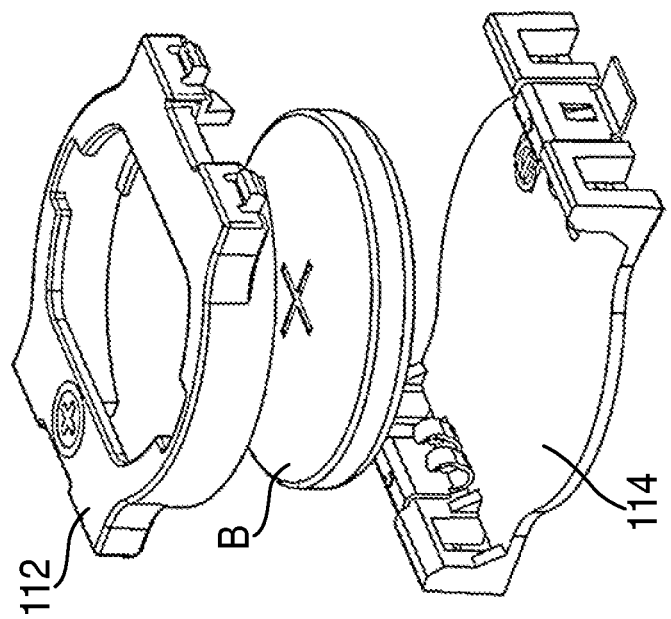
FIG. 6 is an exploded perspective view thereof.
Figure 5:
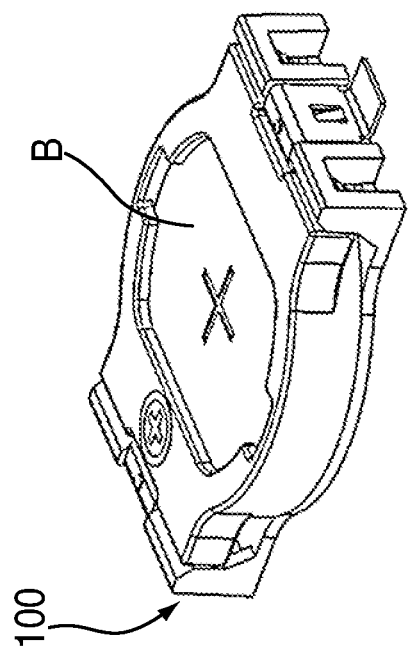
FIG. 5 is a perspective view of the first embodiment of the battery holder of the present invention including a battery.

FIGS. 5 and 6 show the battery holder 100 with the battery B installed. As described above, battery B is positioned in battery compartment 118 and connects with negative battery contact 142 and positive battery contact 132.

Figure 7:
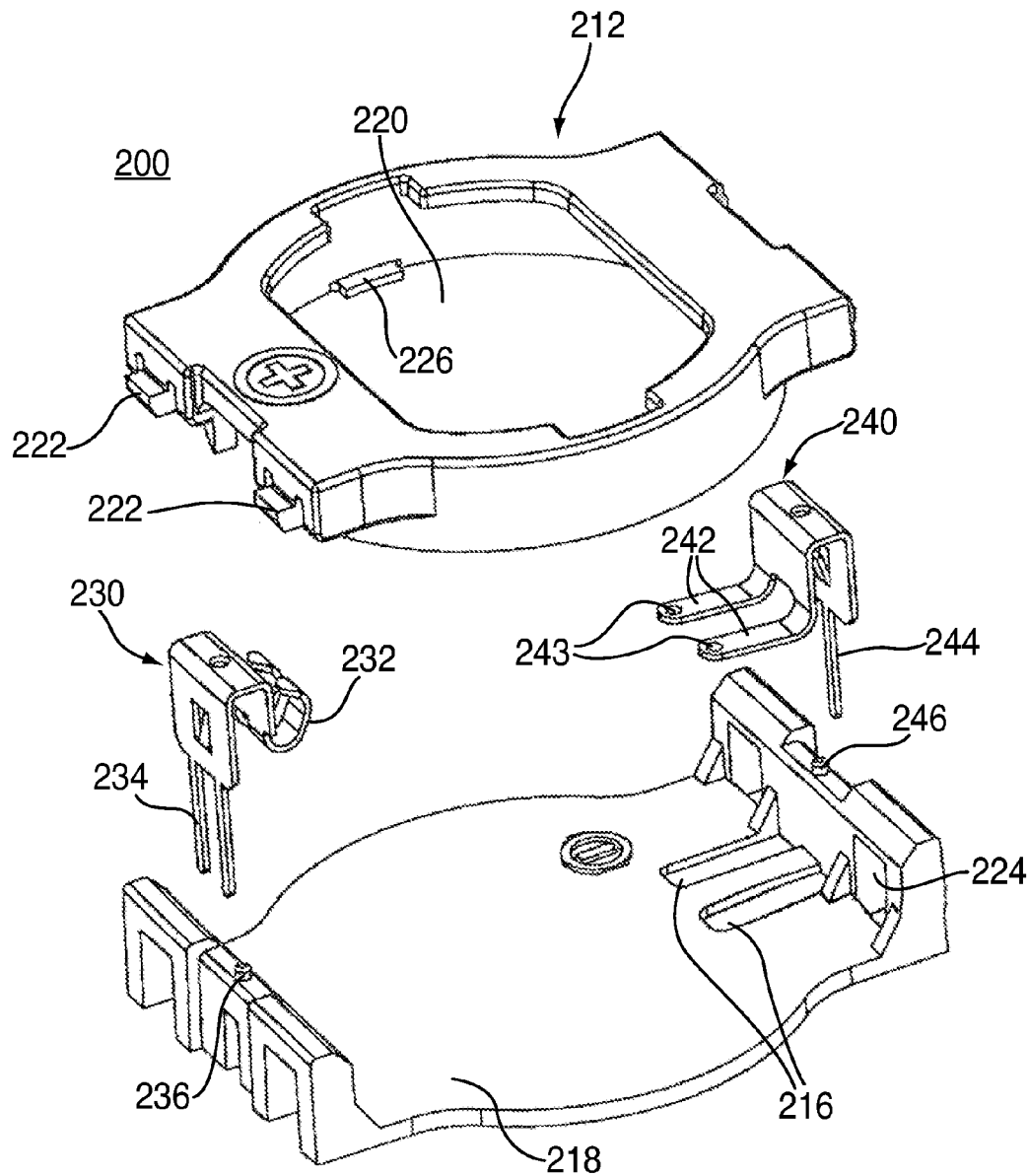
FIG. 7 is an exploded perspective view of a second embodiment of the battery holder of the present invention.
Figure 8:
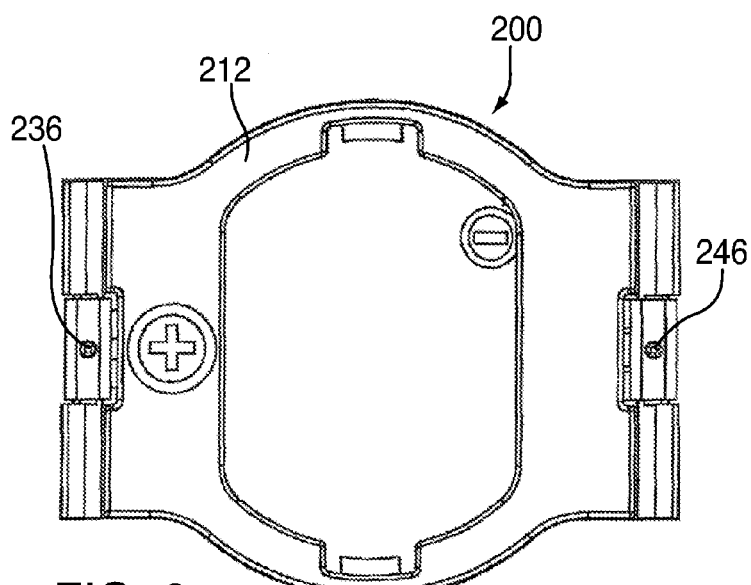
FIG. 8 is a top view of the second embodiment of the battery holder of the present invention.
Figure 9:
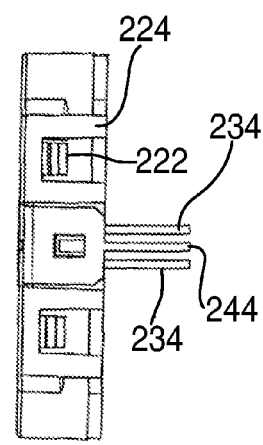
FIG. 9 is a front view thereof.

FIG. 7 illustrates a second preferred embodiment of the present invention. Battery holder 200 is similar to the previously described battery holder 100. Battery holder 200 differs from battery holder 100 with regard to positive conductor 230 and negative conductor 240.

Battery holder 200 includes top 212, base 214, positive conductor 230 and negative conductor 240. Top 212 includes window 220, battery lock 226 and top latches 222. Base 214 includes battery compartment 218, negative contact depressions 216, latch bottoms 224 and connectors 236, 246.

Positive conductor 230 includes positive battery contact 232 and positive mounting pin 234. In the preferred embodiment, positive mounting pin 234 is a dual mounting pin as shown in FIG. 7.

Figure 10:
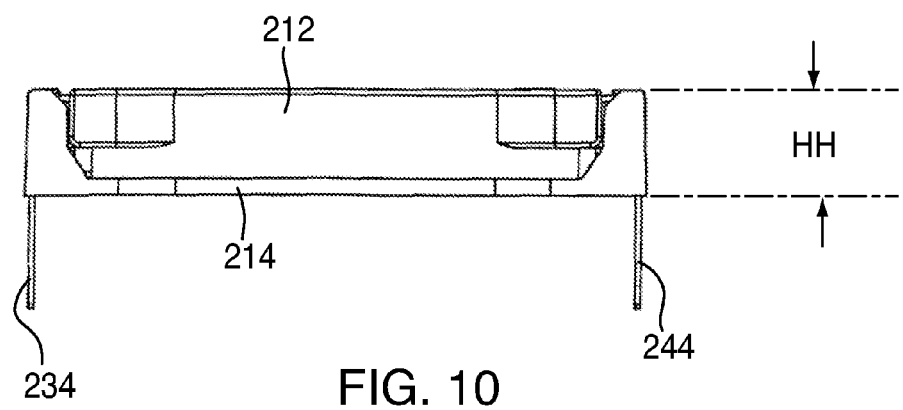
FIG. 10 is a side view thereof.
Figure 12:
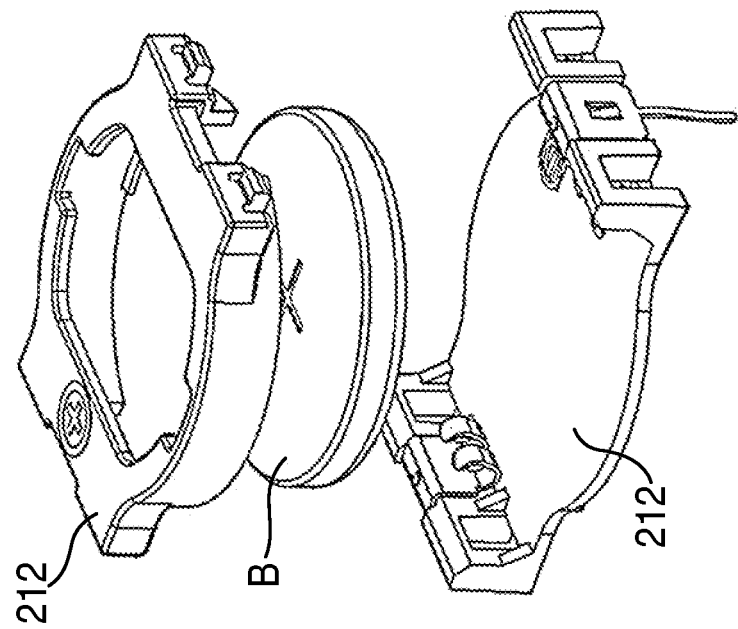
FIG. 12 is an exploded view thereof.
Figure 11:
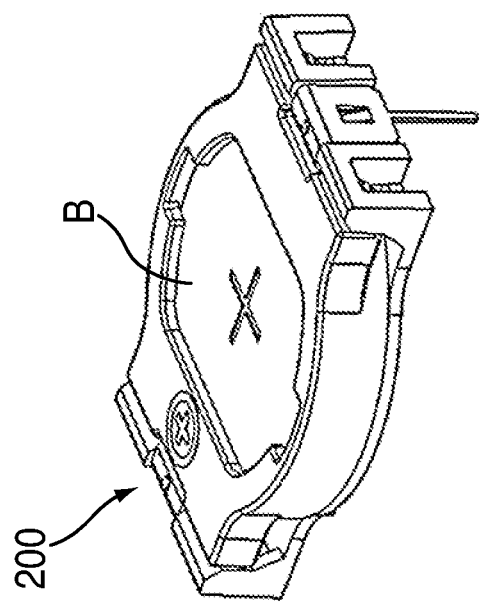
FIG. 11 is a perspective view of the second embodiment of the battery holder of the present invention including a battery.

Negative conductor 240 includes a negative battery contact 242, negative contact bumps 243 and a negative mounting pin 244. Negative mounting pin 244 is preferably a single mounting pin. When battery holder 200 is fully assembled, positive mounting pin 234 and negative mounting pin 244 extend below base 214 as illustrated in FIG. 10. When the battery B is installed in the battery holder 200, positive mounting pin 234 and negative mounting pin 244 become extensions of the battery for integrating with a printed circuit board.

Although the invention is described in terms of particular embodiments, it is to be understood that the embodiments are merely illustrative of an application of the principles of the invention. Numerous modifications may be made and other arrangements may be devised without departing from the spirit and scope of the invention.

The invention claimed is:

1. A system for enclosing a battery and integrating with a printed circuit board, the system comprising:
   a base constructed of an insulating material;
   a positive conductor fixed to the base and including a first positive contact for connecting with the battery and a second positive contact for connecting with the printed circuit board, the first positive contact and the second positive contact extending from the positive conductor;
   a negative conductor fixed to the base and including a first negative contact for connecting with the battery and a second negative contact for connecting with the printed circuit board, the first negative contact and the second negative contact extending from the negative conductor; and
   a top constructed of an insulating material and including a window and a plurality of fasteners that are adaptable to non-rotatably fix the top with the base and selectively enclose the positive conductor, the negative conductor and the battery.

2. The system of claim 1, wherein the second positive contact and the second negative contact are mounting pins that extend downward from the system.

3. The system of claim 1, wherein the second positive contact and the second negative contact are mounting surfaces that are flat and extend substantially parallel to the base.

4. The system of claim 1, wherein the base is fixed to the printed circuit board.

5. The system of claim 1, wherein the base includes a flat layer between the printed circuit board and a battery compartment and the top includes a second flat layer positioned at the top of the battery compartment, wherein the flat layer and the second flat layer are each 0.030 inches thick.

6. The system of claim 5, wherein the overall height of the system is the height of the battery, the flat layer and the second flat layer.

7. The system of claim 1, wherein the plurality of fasteners are latches.

8. The system of claim 1, wherein the window is adapted to provide visual identifying information about the polarity of the battery.

9. The system of claim 1, wherein said top includes a sidewall and a battery lock that extends inwardly from the sidewall toward the window and is adaptable to secure the battery to the top.

10. The battery holder of claim 1, wherein the base includes depressions, and the first negative contact and the second negative contact are adaptable to be arranged within the depressions and below the battery positioned on the base.

11. The battery holder of claim 1, wherein the base includes a plurality of openings configured to interact with the fasteners to secure the top with the base.

12. A system for enclosing a battery and integrating with a printed circuit board, the system comprising:
   a base;
   a positive conductor fixed to the base and including a first positive contact for connecting with the battery, a second positive contact for connecting with the printed circuit board and a positive mounting member extending both substantially flat and parallel to the base, the first positive contact and the second positive contact extending in a first direction from the positive conductor and the positive mounting member extending in a second direction from the positive conductor;
   a negative conductor fixed to the base and including a first negative contact for connecting with the battery, a second negative contact for connecting with the printed circuit board and a negative mounting member extending both substantially flat and parallel to the base, the first negative contact and the second negative contact extending in a first direction from the negative conductor and the negative mounting member extending in a second direction from the positive conductor; and
   a top including a window that is connectable with the base to enclose the positive conductor, the negative conductor and the battery.

13. The battery holder of claim 12, wherein the base is fixed to the printed circuit board.

14. The battery holder of claim 12, wherein the base includes a flat layer between the printed circuit board and a battery compartment and the top includes a second flat layer positioned at the top of the battery compartment, wherein the flat layer and the second flat layer are each 0.030 inches thick.

15. A system for enclosing a battery and integrating with a printed circuit board, the system comprising:
- a base;
- a positive conductor fixed to the base and including a first positive contact extending from the positive conductor for connecting with the battery and a second positive contact extending from the positive conductor for connecting with the printed circuit board;
- a negative conductor fixed to the base and including a first negative contact extending from the negative conductor for connecting with the battery and a second negative contact extending from the negative conductor for connecting with the printed circuit board; and
- a top including a window and connectable with the base to completely circumferentially surround the positive contacts, the negative contacts and the battery.

16. The system of claim 15, wherein the base is fixed to the printed circuit board.

17. The system of claim 15, wherein the base includes a flat layer between the printed circuit board and a battery compartment and the top includes a second flat layer positioned at the top of the battery compartment, wherein the flat layer and the second flat layer are each 0.030 inches thick.

18. A system for enclosing a battery and integrating with a printed circuit board, the system comprising:
- a base including depressions extending therein;
- a positive conductor fixed to the base and including a first positive contact extending from the positive conductor for connecting with the battery and a second positive contact extending from the positive conductor for connecting with the printed circuit board;
- a negative conductor fixed to the base and including a first negative contact extending from the negative conductor for connecting with the battery adaptable to fit into one of the depressions and a second negative contact extending from the negative conductor for connecting with the printed circuit board adaptable to fit into another one of the depressions; and
- a top including a window that is connectable with the base to surround the positive contacts, the negative contacts and the battery.

19. The system of claim 18, wherein the base is fixed to the printed circuit board.

20. The system of claim 18, wherein the base includes a flat layer between the printed circuit board and a battery compartment and the top includes a second flat layer positioned at the top of the battery compartment, wherein the flat layer and the second flat layer are each 0.030 inches thick.

21. A system for enclosing a battery and integrating with a printed circuit board, the system comprising:
- a base;
- a positive conductor fixed to the base and including a first positive contact extending from the positive conductor for connecting with the battery and a second positive contact extending from the positive conductor for connecting with the printed circuit board;
- a negative conductor fixed to the base and including a first negative contact extending from the negative conductor for connecting with the battery and a second negative contact extending from the negative conductor for connecting with the printed circuit board; and
- a top including a sidewall, a battery lock that extends inwardly from the sidewall toward a window and is adaptable to secure the battery to the top and the window, the top being connectable with the base to surround the positive contacts, the negative contacts and the battery.

22. The system of claim 21, wherein the base is fixed to the printed circuit board.

23. The system of claim 21, wherein the base includes a flat layer between the printed circuit board and a battery compartment and the top includes a second flat layer positioned at the top of the battery compartment, wherein the flat layer and the second flat layer are each 0.030 inches thick.

\* \* \* \* \*